United States Patent
Singer et al.

(10) Patent No.: US 11,662,070 B2
(45) Date of Patent: May 30, 2023

(54) OPTOELECTRONIC FIBER, PLACEMENT DEVICE, EXTRUSION APPARATUS, AND APPARATUS AND METHOD FOR PRODUCING AN OPTOELECTRONIC FIBER

(71) Applicant: OSRAM OLED GmbH, Regensburg (DE)

(72) Inventors: Frank Singer, Regenstauf (DE); Ralph Bertram, Herzogenrath (DE); Andreas Dobner, Wenzenbach (DE); Andreas Waldschik, Wolmirstedt OT Elbeu (DE)

(73) Assignee: OSRAM OLED GmbH, Regensburg (DE)

( * ) Notice: Subject to any disclaimer, the term of this patent is extended or adjusted under 35 U.S.C. 154(b) by 195 days.

(21) Appl. No.: 17/259,064

(22) PCT Filed: Jul. 10, 2019

(86) PCT No.: PCT/EP2019/068540
§ 371 (c)(1),
(2) Date: Jan. 8, 2021

(87) PCT Pub. No.: WO2020/011857
PCT Pub. Date: Jan. 16, 2020

(65) Prior Publication Data
US 2021/0285607 A1 Sep. 16, 2021

(30) Foreign Application Priority Data
Jul. 10, 2018 (DE) ............. 10 2018 116 650.8

(51) Int. Cl.
*F21S 4/20* (2016.01)
*F21V 9/30* (2018.01)
(Continued)

(52) U.S. Cl.
CPC ............... *F21S 4/20* (2016.01); *B29C 48/06* (2019.02); *B29C 48/154* (2019.02);
(Continued)

(58) Field of Classification Search
CPC ............................ F21V 23/002; F21V 23/001
See application file for complete search history.

(56) References Cited

U.S. PATENT DOCUMENTS

| 5,932,149 A | 8/1999 | Schneider |
| 2009/0154156 A1 | 6/2009 | Lo et al. |

(Continued)

FOREIGN PATENT DOCUMENTS

| CN | 102384447 A | 3/2012 |
| DE | 196 05 276 A1 | 8/1997 |

(Continued)

OTHER PUBLICATIONS

International Search Report issued for corresponding International Patent Application No. PCT/EP2019/068540 dated Oct. 9, 2019, along with an English translation.
Written Opinion issued for corresponding International Patent Application No. PCT/EP2019/068540 dated Oct. 9, 2019.

*Primary Examiner* — Andrew J Coughlin
(74) *Attorney, Agent, or Firm* — Hauptman Ham, LLP (57) ABSTRACT

A placement device for placing optoelectronic components on electrical lines includes a holding device for holding at least one electric line extending in a longitudinal direction, and an application device for arranging optoelectronic components on the at least one electrical line.

14 Claims, 4 Drawing Sheets

(51) Int. Cl.
  *B29C 48/154* (2019.01)
  *B29C 48/06* (2019.01)
  *B29C 48/30* (2019.01)
  *H01L 25/075* (2006.01)
  *H01L 33/54* (2010.01)
  *B29K 83/00* (2006.01)
  *B29L 11/00* (2006.01)
  *B29L 31/34* (2006.01)

(52) U.S. Cl.
  CPC .............. *B29C 48/304* (2019.02); *F21V 9/30* (2018.02); *H01L 25/0753* (2013.01); *H01L 33/54* (2013.01); *B29K 2083/00* (2013.01); *B29K 2995/0035* (2013.01); *B29L 2011/0075* (2013.01); *B29L 2031/3462* (2013.01)

(56) References Cited

U.S. PATENT DOCUMENTS

| | | |
|---|---|---|
| 2010/0157598 A1 | 6/2010 | Tsai |
| 2010/0164409 A1* | 7/2010 | Lo .......................... H05B 45/48 362/234 |
| 2015/0377428 A1 | 12/2015 | Chen et al. |
| 2017/0328527 A1* | 11/2017 | Yang ....................... H01L 33/56 |

FOREIGN PATENT DOCUMENTS

| | | |
|---|---|---|
| DE | 101 52 072 A1 | 5/2003 |
| DE | 10 2012 213 309 A1 | 1/2014 |
| DE | 10 2015 204 778 A1 | 9/2016 |
| DE | 10 2017 101 769 A1 | 8/2018 |
| WO | 2014/026407 A1 | 2/2014 |

\* cited by examiner

OPTOELECTRONIC FIBER, PLACEMENT DEVICE, EXTRUSION APPARATUS, AND APPARATUS AND METHOD FOR PRODUCING AN OPTOELECTRONIC FIBER

CROSS REFERENCE TO RELATED APPLICATION

This application is a National Stage of International Application No. PCT/EP2019/068540, filed on Jul. 10, 2019, which designates the United States and was published in Europe, and which claims priority to German application DE 10 2018 116 650.8, filed on Jul. 10, 2018, both of the aforementioned applications are hereby incorporated by reference in their entireties.

The present invention relates to an optoelectronic fiber, in particular for integration into a textile, an assembly device for equipping electrical lines with optoelectronic components, an extrusion device for producing a sheath, and an apparatus and method for producing an optoelectronic fiber.

Increasingly, luminous textiles, especially garments, are coming onto the market.

The present invention is based, inter alia, on the problem of providing a fiber that is easy to manufacture and particularly easy to use in connection with such textiles. Furthermore, the present invention is based on the problem of creating a possibility by means of which such a fiber can be produced in a simple manner.

A problem of the invention is solved by an optoelectronic fiber having the features of claim 10. A problem of the invention is further solved by a respective device according to the features of claims 1, 7 and 9, respectively, or by a method having the features of claim 22. Preferred embodiments and further embodiments of the invention are given in the dependent claims.

The present invention relates to an optoelectronic fiber particularly for integration into a textile, wherein the optoelectronic fiber comprises:
  at least one electrical line which extends in a longitudinal direction and on which optoelectronic components are arranged, and
  a longitudinally extending sheath, in particular in the form of fibers or threads, which surrounds the at least one electrical line and the optoelectronic components,
  wherein, viewed transversely to the longitudinal direction, the sheath has an outer diameter which is at most 5 mm, preferably at most 2.5 mm, more preferably at most 1 mm, more preferably 1 mm, and still more preferably less than 0.5 mm, and
  wherein, viewed in the longitudinal direction, the fiber has a minimum length of 5 m.

The optoelectronic fiber can in particular be designed and dimensioned in such a way that it can be integrated into a textile, comparable to a textile thread, in particular using the usual weaving and/or knitting and/or embroidery techniques. The optoelectronic fiber can thus not only be arranged on the surface of a textile and fixed there, but it can also be integrated into the fabric of a textile, comparable to a conventional textile thread, in particular for diameters smaller than 1 mm. The fiber has a very large length and can therefore be regarded as an endless fiber, so to speak. Due to its length, the fiber can be integrated particularly well into a fabric for a textile. In addition, it can be wound up well and then provided wound up on a bobbin in the same way as a conventional thread.

Illuminated textiles can be realized by integrating such thread-like light-emitting devices. Such garments can, for example, help to increase the safety of pedestrians or cyclists traveling in poor visibility conditions or in the dark.

The optoelectronic fiber may have a diameter in a range, for example, from 200 µm to 5 mm, for example from 400 µm to 1 mm. For example, depending on the desired field of application, the diameters of the optoelectronic fiber can be up to 600 µm, for example for manufacturing clothing, or up to 5 mm, for example for manufacturing technical fabrics such as tarpaulins.

The optoelectronic components or elements may have a height in a range, for example, from 5 µm to 3 mm, for example, from 50 µm to 500 µm, and a width and/or a length in a range, for example, from 50 µm to 5 mm, for example, from 100 µm to 500 µm. The electrical lines may each have a diameter in a range, for example, from 20 µm to 2 mm, for example, from 50 µm to 200 µm.

Preferably, at least two, three, four or even more electrical lines are provided which extend parallel to one another in the longitudinal direction and on which the optoelectronic components are arranged. One of the electrical lines can be used, for example, as a control line via which control signals can be transmitted to a controller for controlling at least one of the optoelectronic components. The control unit may be arranged, in particular in the vicinity of the component, on the electrical line and surrounded by the sheath. If two or more electrical lines are used, series and parallel circuits as well as combinations of series and parallel circuits of the optoelectronic components can also be realized.

The sheath can be made of a material such that the fiber can be integrated into a textile in the manner of a thread. The material can be silicone, for example, which can also be mixed with an additive, for example a luminescent material. The material can also be transparent, clear or diffuse.

The sheath may, for example, comprise plastic or be formed by plastic. For example, the sheath may comprise or be formed from PMMA, PC, PES, PET, PA, PI, PAI, PPS, PAN, PTFE, PE, PP, PVC, polyurethane, silicones, silazanes, and/or siloxanes. The sheath may optionally comprise scattering particles and/or conversion material for converting the light emitted from the first optoelectronic device.

In particular, the sheath can be dimensioned and designed in such a way that the formed, thread-like fiber behaves at least approximately like a textile thread and, in particular, forms a flexible structure which—viewed in the longitudinal direction—has at least essentially a dominant one-dimensional extension and/or a uniform cross section. The cross-section is preferably circular, rectangular or square. Oval cross sections are also possible. The electrical lines and the optoelectronic components arranged on the electrical lines can also be dimensioned in the corresponding manner. In particular, the electrical lines can be designed so that, as part of the fiber, they behave in a flexible manner and thus do not break or tear when they are worked into a textile fabric with normal textile threads.

The optoelectronic components may be semiconductor components in particular, such as LEDs or semiconductor lasers. In particular, the components can be designed in the form of an LED chip.

Since the sheath is intended to completely surround both the electrical lines and the electronic semiconductor components, the semiconductor components are also dimensioned to be correspondingly small. For example, LEDs can be used which have heights in the range of 5-20 µm.

The formulation that the optoelectronic components are arranged or located on the electrical lines includes in particular that a permanent electrical contact is made between the optoelectronic components and the electrical lines. The optoelectronic components can have contact areas which are located, for example, on the underside of the components. These contact areas can be brought into permanent mechanical and electrical contact with the electrical lines in a manner known per se. The optoelectronic components can be housed components. However, they can also be LED chips that are not housed.

The sheath can be produced by means of an extrusion process. In this way, the fiber can be produced particularly easily and, in particular, also as a "continuous fiber". The use of an extrusion process also has the advantage that the extrusion material can surround the parallel electrical lines and thus insulate them from one another. A short circuit between the electrical lines can thus be avoided. It is thus possible to also use non-insulated electrical lines to manufacture the optoelectronic fiber.

The sheath may completely surround the optoelectronic components and the at least one electrical line in a circumferential direction extending around the longitudinal direction. To form such a fiber, the sheath may be provided as a flat, planar tape having a long side extending in a longitudinal direction, the tape having a width at least approximately equal to the circumference of the sheath to be formed. The at least one electrical line with components disposed thereon may be centered on the tape. Alternatively, the at least one electrical line may be equipped with the optoelectronic components after the at least one electrical line rests on the tape. The lateral end regions of the tape are then folded upwards so that the at least one electrical line and the components are completely enveloped by the tape.

The optoelectronic fiber can also have lengths other than 5 m, in particular, for example, a length of at least 7.5 m, 10 m, 15 m or 20 m. Much longer lengths are also possible, for example at least 100 m, 200 m, 300 m, 400 m or 500 m. Lengths of one or more kilometers are also possible.

Preferably, the optoelectronic components are arranged spaced apart from one another along the at least one electrical line, in particular at a uniform distance, as viewed in the longitudinal direction. The optoelectronic components can thereby form a row of components on the at least one electrical line, viewed in the longitudinal direction.

In order that the optoelectronic components can be supplied with current and/or, if necessary, with a control signal, each component is electrically in contact with the electrical line or lines.

It may be provided that a number of optoelectronic components are arranged on an interposer. Several such interposers may be arranged along the at least one electrical line. Viewed in the longitudinal direction, the interposers can be spaced apart from one another. In particular, the distance between successive interposers can be uniform.

A controller, in particular in the form of an IC, which may also be referred to as an integrated circuit, may be arranged on some or each of the interposers. The controller may be designed in particular to control optoelectronic components associated with the controller. For example, an LED may be arranged on each interposer, and a controller may be provided on every sixth interposer in addition to the LED, which controller is designed to control six LEDs on six different interposers.

The control unit and the components can be arranged in particular on an upper side of the interposer and electrically connected to each other. The interposer can have contact areas on its underside via which the interposer is electrically connected to the at least one electrical line.

A controller for controlling one or more optoelectronic components, such as an LED, arranged on one or more interposers can also be arranged separately, i.e. in particular not on an interposer on which an optoelectronic component is located. For example, the controller may be arranged in the sheath. Via the at least one electrical line, the control can be in electrical contact with the optoelectronic components associated therewith.

Preferably, the optoelectronic fiber has at least one further electrical or electronic component arranged on and electrically connected to the at least one electrical line. The further electrical or electronic component may also be arranged on the electrical line via an interposer. The component may, for example, be a small printed circuit board with electronic circuits, for example for implementing driver components, or also housed components such as resistors or the like. Preferably, the enclosure also surrounds the component.

The invention also relates to a placement device for placing optoelectronic components on electrical lines. The placement apparatus comprises a holding device for holding at least one electrical line extending in a longitudinal direction. The placement device further comprises an application device for arranging optoelectronic components on the at least one electrical line.

By means of the holding device, the at least one electrical line, or at least a section of an electrical line, can be held in such a way that the electrical line extends in the longitudinal direction. In the case of two or more electrical lines, these are aligned at least substantially parallel to one another in the longitudinal direction. They can thereby be arranged and held at a certain distance from each other.

By means of the application device, the optoelectronic components can be applied to the at least one electrical line or arranged along the electrical line, for example spaced apart from one another in the longitudinal direction.

Preferably, the holding device is designed to hold at least two electrical lines, such that the electrical lines extend at least substantially parallel to each other and at a certain distance from each other in the longitudinal direction. The distance can be set depending on the optoelectronic components to be arranged and correspond, for example, to a pad spacing of LED chips.

The holding device can have a conveying device by means of which the at least one electrical line, if necessary with the optoelectronic components arranged thereon, can be conveyed in the longitudinal direction. The conveying device can be used, for example, to feed the at least one electrical line with the components arranged thereon to an extrusion apparatus downstream of the placement device.

The conveyor can have a conveyor belt, in particular including a foil, wherein the conveyor belt can be moved in the longitudinal direction and on which the at least one electrical line can be arranged or is arranged. The foil can in particular be an adhesive foil on which the electric lines can be arranged, in particular in such a way that they extend parallel to one another at a predetermined distance in the longitudinal direction.

By means of an adhesive on the foil, the electrical lines can be held in a desired orientation and at a desired distance from one another. Furthermore, by means of a movement of the conveyor belt, the electrical lines can be pulled off a respective spool/bobbin on which a respective electrical line is wound.

The conveyor belt may have a structured carrier foil or be formed therefrom. In the case of the carrier foil, the at least one electrical line may be implemented in the form of at least one conductive track extending longitudinally on the carrier foil. After the at least one conductive track is populated with the components, the carrier foil may be peeled or dissolved from the at least one conductive track, for example, via a chemical process, a thermal process, a mechanical process, or an irradiation process. A mechanical process may include peeling and/or rolling up the carrier foil.

A cutting device for cutting the electrical lines can be arranged downstream of the holding device, as seen in the longitudinal direction. The cutting device can be arranged between the holding device and a downstream extrusion device. The cutting device can in particular have a laser for cutting the electrical lines by means of a laser beam. Mechanical severing, in particular using a cutting device, is also possible. The severing device can therefore comprise a cutting device for mechanically severing the electrical lines.

The holding device can have a tensioning device by means of which the electrical lines can be tensioned in the longitudinal direction.

The invention also relates to an extrusion apparatus for producing a sheath, the apparatus comprising:

a feeder for feeding at least one electrical line extending in a longitudinal direction with optoelectronic components arranged thereon to an extruding device. The extrusion apparatus further comprises a further feeder for feeding extrusion material to the extruding device. In this case, the extrusion apparatus is designed to encase or sheathe the at least one electrical line with the optoelectronic components arranged thereon with the extrusion material.

The extrusion material can be the same material as the abovementioned materials for the sheath and, if necessary, can be mixed with a fluorescent material or a conversion material.

The extrusion apparatus can be designed to convey the at least one electrical line with the optoelectronic components arranged thereon in the longitudinal direction. This allows the at least one electrical line and the components arranged thereon to be conveyed through the extrusion apparatus.

The extrusion apparatus can also have, in particular in the region of or downstream of the extrusion apparatus, a curing device by means of which the extruded material can be hardened. The curing device may comprise an ultraviolet light source, or a thermal curing device. Thermal curing can be realized, for example, by means of infrared or laser radiation.

The invention also relates to an apparatus for manufacturing an optoelectronic fiber having a placement device according to the invention and an extrusion apparatus according to the invention, the extrusion apparatus being arranged downstream of the placement device, as viewed in the longitudinal direction.

The invention further relates to a textile fabric, in particular a garment or an interior trim piece of a vehicle or a curtain, comprising a plurality of textile threads and at least one optoelectronic fiber according to the invention, wherein the plurality of textile threads and the at least one fiber according to the invention form a textile fabric. The interior trim member may be a headliner or a side trim of a door of a vehicle.

The invention also relates to a method of producing an optoelectronic fiber, the method comprising the steps of:
providing at least one electrical line extending in a longitudinal direction,
arranging optoelectronic components on the at least one electrical line, and
producing a sheath around the at least one electrical line and the optoelectronic components arranged thereon by means of an extrusion process.

To produce the sheath, the at least one electrical line, in particular its respective front end, with the optoelectronic components arranged thereon can be conveyed through an extrusion apparatus.

The at least one electrical line may be unwound from a coil/bobbin.

The at least one electrical line may be disposed on a conveyor belt such that the electrical line extends longitudinally, and the at least one electrical line may be populated with the optoelectronic components when on the conveyor belt.

The at least one electrical line with the optoelectronic components can be conveyed through the extrusion apparatus by means of the conveyor belt to produce the sheath around the at least one electric line and around the components in the extrusion apparatus.

The optoelectronic components can be arranged on the at least one electrical line from one side or from two sides. In particular, at least two electrical lines can be arranged parallel to each other in a horizontal plane in the longitudinal direction. The optoelectronic components can then be applied to and arranged on the electrical lines from an upper side. In a modification, the optoelectronic components can be applied to and arranged on the electrical lines from the top side and from the bottom side.

The invention also relates to a method of producing an optoelectronic fiber, the method comprising the steps of:
providing at least one electrical line extending in a longitudinal direction,
arranging optoelectronic components on the at least one electrical line, and
providing a sheath, in particular of flat design, on which the at least one electrical line is arranged and aligned in the longitudinal direction, wherein at least one end section of the sheath lying in the transverse direction to the longitudinal direction being folded over so that the sheath completely surrounds the at least one electrical line and the optoelectronic components arranged thereon in the circumferential direction.

The placement of the optoelectronic components on the at least one electrical line may occur after the electrical line has been placed on the flat enclosure.

In the following, exemplary embodiments of the invention are explained in more detail with reference to the accompanying figures. They show, schematically in each case, FIG. 1 a top view of an optoelectronic fiber, FIG. 2 a cross-sectional view of the fiber of FIG. 1, FIG. 3 a perspective view of a device for manufacturing an optoelectronic fiber, FIG. 4 a cross-sectional view illustrating a manufacturing process for an optoelectronic fiber, FIG. 5 a cross-sectional view of the fiber produced according to the illustration of FIG. 4, FIG. 6 a cross-sectional view of two interconnected and parallel electrical lines, FIG. 7 a cross-sectional view of an optoelectronic fiber fabricated using the conductors of FIG. 6, and FIGS. 8-10 provide illustrations of a manufacturing process for producing a filamentary optoelectronic fiber, wherein the lower portion of each of FIGS. 8-10 shows a side view and the upper portion of each of FIGS. 8-10 shows a bottom view.

Figure 1:
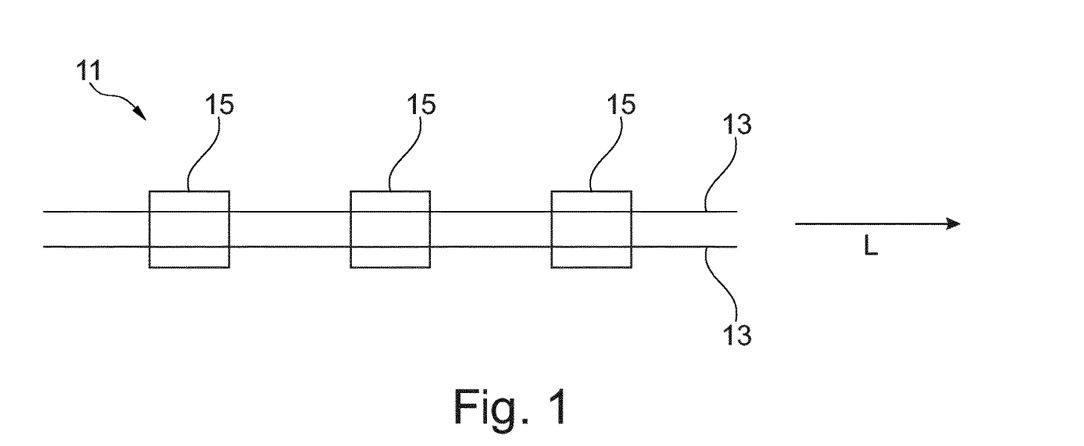
Figure 2:
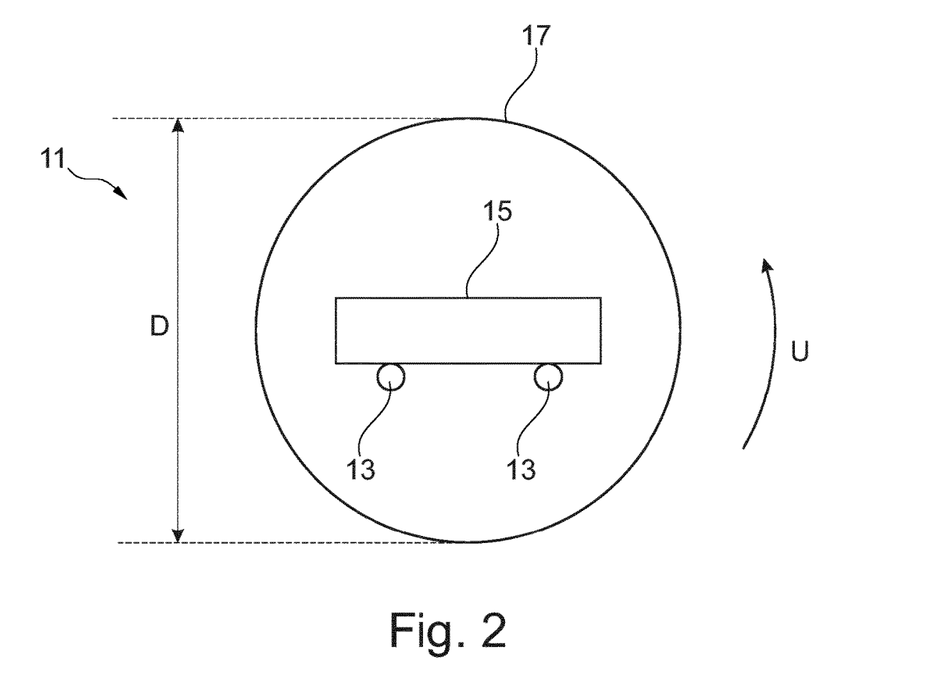

The optoelectronic fiber 11 shown in FIGS. 1 and 2 has two electrical lines 13 running parallel to each other and extending in a longitudinal direction L. The optoelectronic components 15 are arranged on the electrical lines 13.

Optoelectronic components 15 are arranged on the electrical lines 13, spaced apart from one another as viewed in the longitudinal direction L. Each component 15 is arranged in such a way that it is permanently electrically connected to the electrical line 13.

Each optoelectronic component 15 may be configured, for example, as an LED chip whose underside has electrical contacts through which the component 15 may be connected to the electrical lines 13.

The fiber 11 comprises a sheath 17 shown in FIG. 2, which extends in the longitudinal direction L and completely surrounds the electrical lines 13 and the components 15. The sheath 17 preferably has a uniform, for example circular, cross-section. The sheath 17 completely surrounds the electrical lines 13 and the components 15 arranged thereon, as viewed in the circumferential direction U. The circumferential direction U thereby surrounds the longitudinal direction L. The sheath 17 is in particular formed in one piece. Longitudinal sections may be present in which the sheath 17 is at least partially removed, for example in order to guide sections of the electrical lines 13 to the outside or in order to contact the electrical lines 13.

If, as in the embodiment example shown in FIGS. 1 and 2, two electrical lines 13 are arranged in the fiber 11, the optoelectronic components 15 are normally all connected in parallel. In addition to the two electrical lines 13, at least one further parallel electrical line 13 may be provided. By suitable interconnection of the components 15 with the electrical lines, a series connection of the components 15 can be realized as an alternative to a pure parallel connection.

By means of three parallel electrical lines 13, a combination of a series circuit and a parallel circuit can also be implemented as an alternative to a pure parallel circuit and a pure series circuit. This can be provided, for example, to adjust the lines 13 in a ratio of voltage and current that is particularly favorable for long linear arrangements of components 15.

The optoelectronic fiber 11 is designed in particular as a continuous fiber and has a particularly large length as viewed in the longitudinal direction L. In particular, it is provided that the fiber 11 has a minimum length of 5 m. This makes the fiber particularly suitable for integration into a textile. It can thus be processed in a similar way to a conventional textile fiber.

Viewed transversely to the longitudinal direction L, the sheath 17 preferably has an outer diameter D which is at most 5 mm, preferably at most 2.5 mm, further preferably at most 1 mm. Other, smaller diameters are also possible. The components 15 are of correspondingly small dimensions.

The materials of the fiber 11, i.e. in particular the material of the sheath 17 and/or of the electrical lines 13, are preferably designed and dimensioned in such a way that the fiber 11 behaves at least approximately like a textile fiber and thus forms a flexible structure which can be processed like a conventional fiber.

Figure 3:
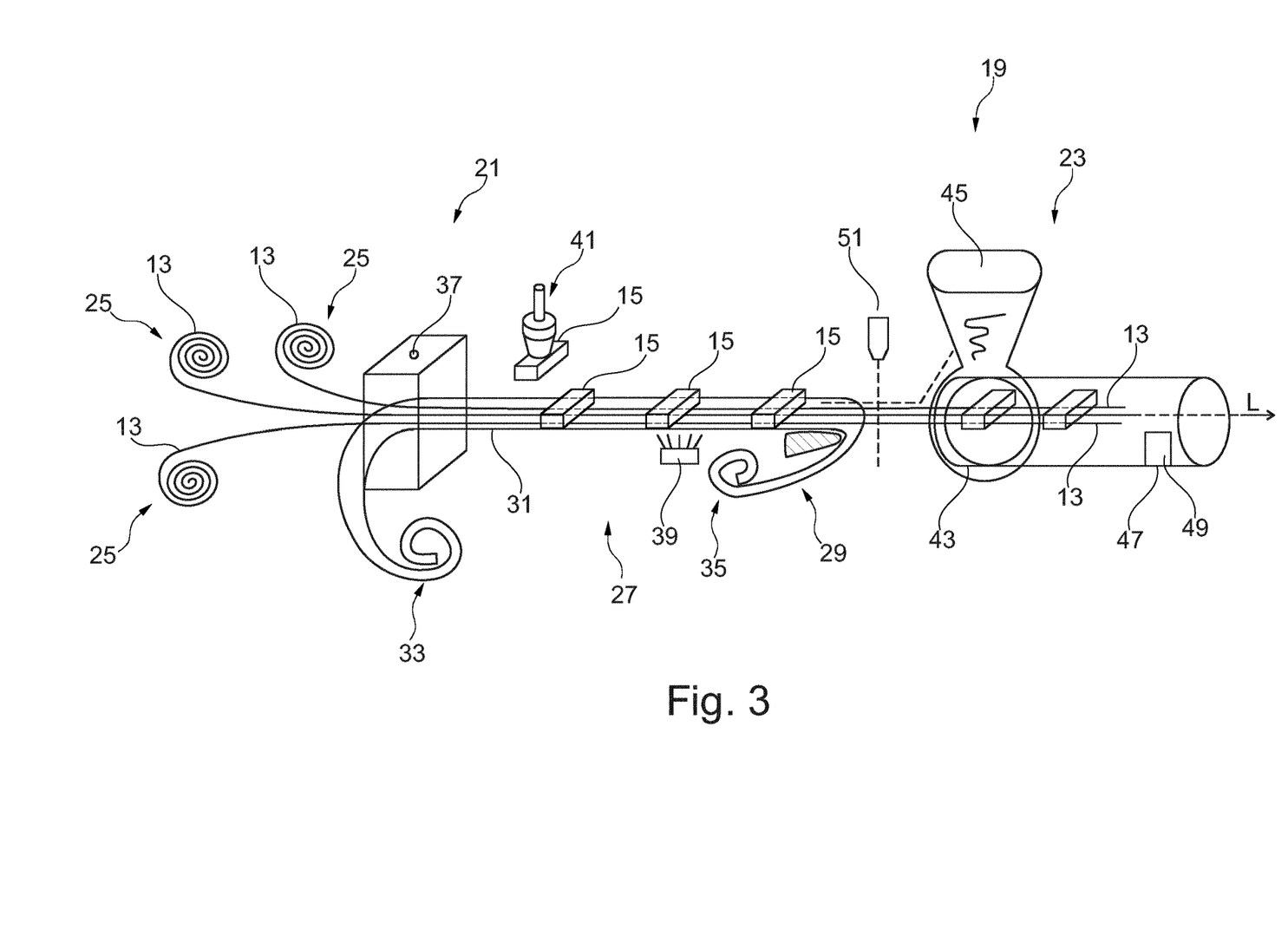

The device 19 for manufacturing an optoelectronic fiber shown in FIG. 3 comprises a placement device 21 and an extrusion apparatus 23, which is arranged downstream of the placement device 21 in a longitudinal direction L.

The placement device 21 is provided in particular for the placement of optoelectronic components 15 on electrical lines 13. In the example described, three electrical lines 13 are provided, of which one electrical line 13 may serve as a signal line, while the other two lines 13 may be provided for supplying current and voltage to the components 15. The electrical lines 13 may be wound on bobbins/coils 25, from which they are unwound to form an optoelectronic fiber.

The placement device 21 has a holding device 27. This is provided for holding portions of the lines 13 which have been unwound from the bobbins 25. For simplicity, the unwound sections of the lines 13 are referred to hereinafter simply as electrical lines 13.

The holding device 27 is configured such that the three electrical lines 13 can be held or fixed such that the three electrical lines 13 extend at least substantially parallel to each other and at a certain distance from each other in the longitudinal direction L. The distance can be selected or adjusted such that contact areas of the components 15, which are arranged offset in longitudinal direction L on the electrical lines 13, come into contact with the respective electrical line 13 and are connected to the electrical lines 13 in a correct manner.

In the example according to FIG. 3, the holding device 27 has a conveyor device 29 comprising a conveyor belt 31 which is movable in the longitudinal direction L. The conveyor belt 31 is formed by an adhesive film which is drawn off from a first roller 33 and wound onto a second roller 35 by the conveying operation. Alternatively, a circulating conveyor belt may be provided.

Since the conveyor belt 31 is formed by an adhesive sheet, the three electrical lines 15, as shown in FIG. 3, can be arranged parallel to each other and at the intended distance from each other aligned in the longitudinal direction L on the conveyor belt 31 and held there. By moving the conveyor belt 31 in the longitudinal direction L, the electrical lines 13 can be moved in this direction. In the process, further conductive material can be drawn off from the bobbins 25 and thus supplied subsequently.

To ensure that the electrical lines 13 remain mechanically tensioned, the holding device 27 can have a tensioning device 37, which can also be used to set a desired distance between the electrical lines 13. The tensioning device 37 can be arranged upstream of the conveyor belt 31, as seen in the longitudinal direction L. The tensioning device 37 can, for example, have individual bushings for a respective electrical line 13. In this case, a respective electrical line 13 can be pulled through a feedthrough by means of the conveyor belt 31 and by applying a tensile force. As a result, the electrical lines 13 are tensioned in the longitudinal direction L in the region between the conveyor belt 31 and the tensioning device 37. Further devices may be provided along the conveyor section, such as deceleration and/or buffer sections. Such devices may thereby comprise at least one dancer roller. For example, one of the rollers 33, 35 can be designed as a dancer roller. The dancer roller can be designed to be movable or pivotable and can be under a preload. This can be used to keep the electrical lines 13 under tension. The tensioning device 37 is then not required.

To reduce the adhesive force, the holding device 27 may further comprise a light source 39 by means of which the conveyor belt 31 can be irradiated with UV light. The light can reduce the adhesive force so that the conductors 13 can be detached from the conveyor belt 31.

The placement device 21 further comprises an application device 41 by means of which the optoelectronic components 15 can be arranged, in particular at a regular spacing, on the electrical lines 13. The application may comprise bringing the components 15 permanently into electrical contact with the lines 13.

The application device 41 can be designed to place the components 15 on the electrical lines 13 in a predetermined manner and in a predetermined orientation, bringing contact areas provided on the underside of the components 15 into contact with a respective electrical line 13 and permanently electrically connecting them, for example by means of a soldering process.

The extrusion apparatus 23 comprises a feeder 43 for feeding the electrical lines 13 with the components 15 arranged thereon. The feeder 43 is arranged downstream of the conveyor belt 31 as viewed in the longitudinal direction L, so that the front end of the electrical lines 13 with the components 15 arranged thereon can be continuously fed to the feeder 43 by means of the conveyor belt 31.

As FIG. 3 shows, the feeder 43 can be in the form of a tubular structure with a feed opening. Downstream of the feeder 43, the tubular structure accommodates an extruding device 47 which is designed to encase the fed electrical lines 13 with the electronic components 15 arranged thereon in extrusion material. The extrusion material may be fed via a further feeder 45. The feeder 45 can be in the form of a funnel which opens from the side into the tubular structure of the extruding device 47.

The extruded material can be cured and thus the coating can be formed by means of a curing device 49, which is arranged downstream of the extrusion device 47. The curing device 49 can be designed as a continuous oven or as a UV curing system.

The extrusion apparatus 23 can comprise a conveying device by means of which the electrical lines 13 with the electronic components 15 arranged thereon and the sheath (not shown in FIG. 3) can be conveyed in the longitudinal direction L. This conveying operation can also be accomplished by means of the conveyor belt 31, so that the extrusion apparatus 23 does not require its own conveying device.

At the front end of the extrusion device 47, as viewed in the longitudinal direction L, the tubular structure has an outlet opening from which the sheathed optoelectronic fiber can be continuously provided. Since the optoelectronic fiber can be formed via a continuous process starting from the unwinding of the electrical lines 13 from the bobbins 25, the optoelectronic fiber can be formed in the manner of a continuous fiber.

In order to separate the formed fiber from the electrical lines 13 that have not yet been sheathed, a severing device 51 can be provided between the placement device 21 and the extrusion apparatus 23. This can, for example, comprise a laser for cutting through the electrical lines 13.

Figure 4:
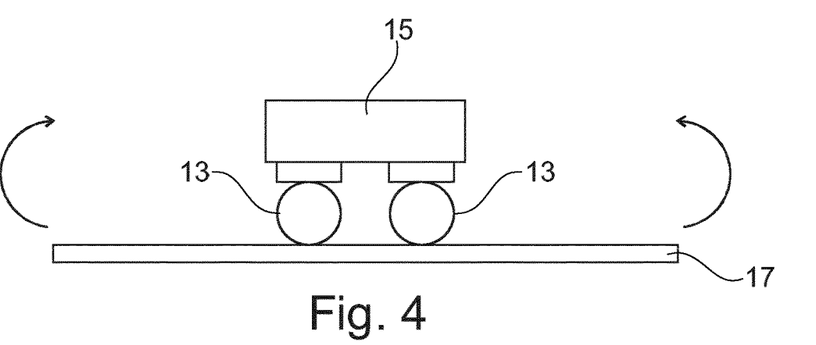

FIG. 4 illustrates an alternative process for manufacturing an optoelectronic fiber. In this process, the sheath 17 is prefabricated and has a plate-like, planar shape. The at least one electrical line 13 is disposed on the sheath 17 with the electronic components 15 disposed thereon. Alternatively, the mounting of the at least one electrical line 13 with the optoelectronic components 15 can also be carried out when the at least one electrical line 13 is arranged on the sheath 17. The lateral end sections of the sheath 17 lying transversely to a longitudinal direction running perpendicular to the image plane are then folded over upwards, as illustrated by the arrows in FIG. 4. In particular, the sheath 17 can be made of a pre-crosslinked silicone material that is cured after folding over, resulting in a completely circumferential, one-piece sheath.

The sheath 17 according to FIG. 4 can be used as a conveyor belt (compare the conveyor belt 31 in FIG. 3) in a placement device 21 according to FIG. 3. As soon as a certain length of the at least one electric wire 13 has been pulled off the bobbin 25 (compare FIG. 3) and arranged on the sheath 17, the latter can be equipped with optoelectronic components 15. After this, the sheath can be folded over, as illustrated in FIG. 4. A downstream extrusion apparatus 23 is not required in this variant.

Figure 5:
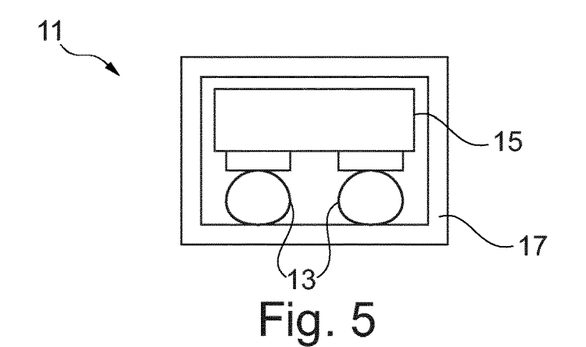

FIG. 5 shows in cross-section the optoelectronic fiber 11 produced by means of the manufacturing process according to FIG. 4. As mentioned, the sheath 17 was formed by folding over the lateral ends of the sheath 17.

Figure 6:
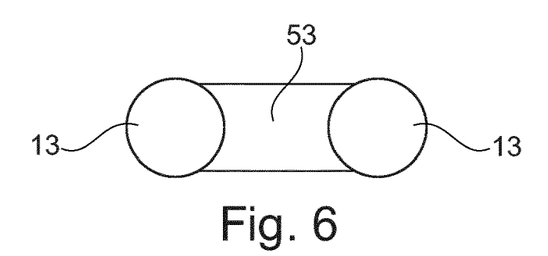

FIG. 6 shows a cross-sectional view of two parallel electric lines 13, between which an insulating material 53 is arranged. The insulating material 53 keeps the two electrical lines 13 parallel to each other at a desired distance along the longitudinal direction L perpendicular to the image plane. A conveyor belt 31, as shown in FIG. 3, is thus not required. This has the advantage that, as FIG. 7 shows, optoelectronic components 15 can be connected to the electrical conductors 13 from above and from below.

Figure 7:
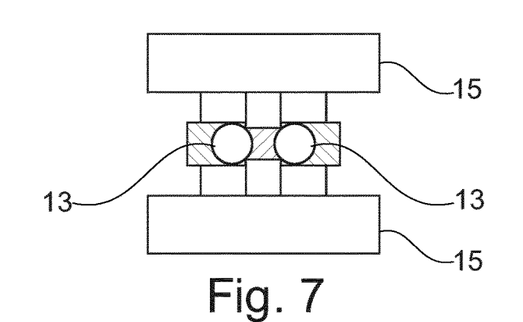

With additional reference to FIG. 3, it should be noted that for manufacturing an optoelectronic fiber 11 having a cross-section according to FIG. 7, the holding device 27 for holding the two electrical lines 13 may be configured without a conveyor belt 31. Thus, the holding device 27 can essentially have guides by means of which the front end of the electrical conductors 13 can be fed to the downstream extrusion apparatus 23 and which allow optoelectronic components 15 to be loaded from above and from below.

Figure 8:
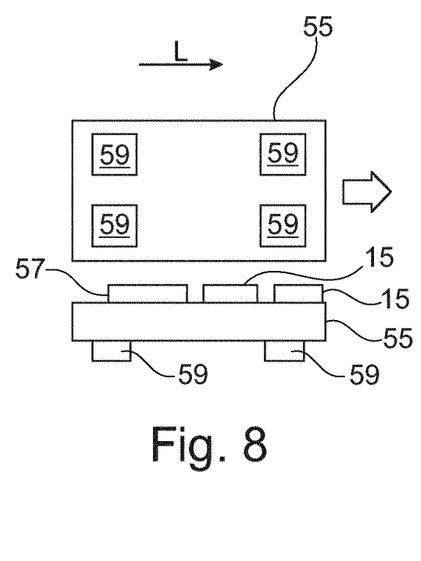
Figure 9:
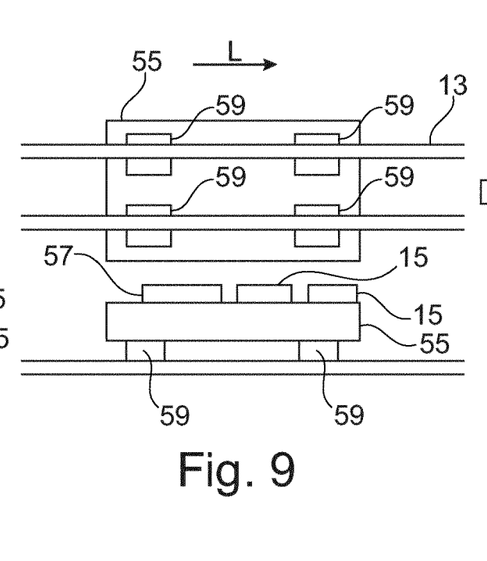
Figure 10:
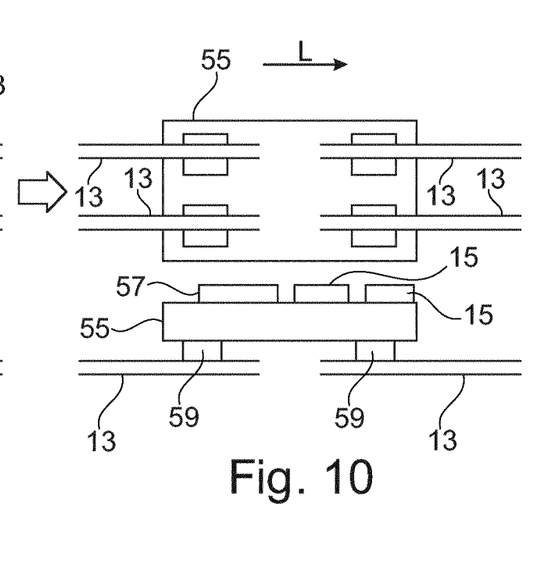

FIGS. 8 to 10 illustrate another manufacturing process for producing an electronic fiber. A significant difference from the manufacturing process illustrated with reference to FIG. 3 is that the optoelectronic components 15 are not arranged directly on the electrical lines 13. Rather, a number (here: 3) of optoelectronic components 15 are arranged on the upper side of an interposer 55 together with a control 57, which is configured, for example, in the form of an integrated circuit. The underside of the interposer 15 is then arranged on electrical lines 13 running in the longitudinal direction L, as FIG. 9 shows. Contact points 59 on the underside of the interposer 55 thereby make electrical contact with the electrical lines 13. Since a respective interposer 55 may have several contact points 59 on its underside, it may be necessary to separate the electrical lines 13, as illustrated in FIG. 10.

Further preferred variants and embodiments of the invention can be found in the following list with numbers 1 to 26:

1. An optoelectronic fiber, in particular for integration into a textile, comprising:

at least one electrical line (13) which extends in a longitudinal direction (L) and on which optoelectronic components (15) are arranged, and a sheath (17) extending in longitudinal direction (L) and surrounding the at least one electrical line (13) and the optoelectronic components (15), wherein, viewed transversely to the longitudinal direction (L), the sheath (17) has an outer diameter (D) which is at most 5 mm, preferably at most 2.5 mm, more preferably at most 1 mm, more preferably 1 mm, and still more preferably less than 0.5 mm, and wherein, viewed in the longitudinal direction (L), the fiber (11) has a minimum length of 5 m.

2. The fiber according to number 1, characterized in that at least two, three, four or even more electrical lines (13) are provided which extend parallel to one another in the longitudinal direction (L) and on which the optoelectronic components (15) are arranged.

3. The fiber according to number 1 or 2, characterized in that
the sheath (17) is made of a material, such as silicone, in such a way that the fiber (11) can be integrated into a textile in the manner of a textile thread.
4. The fiber according to one of the previous numbers, characterized in that
the sheath (17) is produced by means of an extrusion process, or
the sheath (17) is wrapped around the optoelectronic components (15) and the at least one electrical line (13) in a circumferential direction (U) running around the longitudinal direction (L) in such a way that the sheath (17) completely surrounds the components (15) and lines (13) at least in sections.
5. The fiber according to one of the previous numbers, characterized in that
the sheath (17) is transparent or diffuse and/or contains a phosphor mixture and/or a conversion material and/or is formed in one piece.
6. The fiber according to one of the previous numbers, characterized in that
the fiber has, viewed in the longitudinal direction (L), a length of at least 7.5 m, 10 m, 15 m, 20 m or even much greater lengths, such as several hundred meters or one or more kilometers.
7. The fiber according to one of the previous numbers, characterized in that
the optoelectronic components (15), viewed in the longitudinal direction (L), are arranged on the at least one electrical line (13) spaced apart from one another, in particular at a uniform distance, and/or
the optoelectronic components (15) make electrical contact with the at least one electrical line (13).
8. The fiber according to one of the previous numbers, characterized in that
a number of optoelectronic components (15) are arranged on an interposer (55), and a plurality of such interposers (55) are arranged on the at least one electrical line (13), wherein, preferably, viewed in the longitudinal direction (L), the interposers (55) are spaced apart from one another, in particular at a uniform distance.
9. The fiber according to number 8, characterized in that a controller (57), in particular an integrated circuit, is arranged on some or each of the interposers (55), wherein, preferably, the controller (57) of a respective interposer (55) is designed for controlling optoelectronic components (15) assigned to the controller (57).
10. The fiber according to one of the previous numbers, characterized in that
the fiber has at least one further electrical or electronic component (57), which is preferably arranged on the at least one electrical line (13).
11. The fiber according to number 10, characterized in that
the component (57) is arranged within the sheath (17), and/or
the component (57) is electrically connected to at least one electrical line (13).
12. A placement device for placing optoelectronic components (15) on electrical lines (13), with:
a holding device (27) for holding at least one electric line (13) extending in a longitudinal direction (L), and
an application device (41) for arranging optoelectronic components (15) on the at least one electrical line (13).
13. The placement device according to number 12, characterized in that
the holding device (27) is designed for holding at least two electrical lines (13), the lines (13) extending at least substantially parallel to one another and at a certain distance from one another in the longitudinal direction (L).
14. The placement device according to number 12 or 13, characterized in that
the holding device (27) comprises a conveying device (29) for conveying the at least one electric line (13) in the longitudinal direction (L).
15. The placement device according to number 14, characterized in that
the conveyor device (29) comprises a conveyor belt (31), in particular having a foil, which is movable in the longitudinal direction (L) and on which the at least one electric line (13) can be arranged or is arranged.
16. The placement device according to any of the numbers 12 to 15,
characterized in that
a cutting device (51) for cutting at least one electrical line (13) is arranged downstream of the holding device (27), as seen in the longitudinal direction (L).
17. The placement device according to any of the numbers 12 to 16,
characterized in that
the holding device (27) comprises a tensioning device (37) by means of which the electrical lines (13) can be tensioned in the longitudinal direction (13).
18. An extrusion apparatus for producing a sheath (17) having:
a feeder (43) for feeding at least one electrical line (13) extending in a longitudinal direction (L) with optoelectronic components (15) arranged thereon to an extruding device (47),
a further feeder (45) for feeding extruding material, in particular a silicone or a silicone/fluorescent mixture, to the extruding device (47),
wherein the extruding device (47) is designed to encase the at least one electrical line (13) with the optoelectronic components (15) arranged thereon with the extrusion material.
19. The extrusion apparatus according to number 18, characterized in that
the extrusion apparatus is designed to convey the at least one line (13) with the optoelectronic components (15) arranged thereon in the longitudinal direction (L), and/or the extrusion apparatus comprises a curing device (49), in particular by means of UV light, for curing the extruded material.
20. An apparatus for producing an optoelectronic fiber, in particular a fiber according to any one of Nos. 1 to 11, with:
a placement device (21) according to one of the numbers 12 to 17,
an extrusion apparatus (23) according to any of the numbers 18 to 19, and
wherein, viewed in a longitudinal direction (L), the extrusion apparatus (23) is arranged downstream of the placement device (21).

21. A textile fabric, in particular garment or interior trim element of a vehicle, with:
a variety of textile threads, and
at least one fiber (11) according to one of the numbers 1 to 11, which together with the textile threads forms a textile fabric.

22. A method of producing an optoelectronic fiber, the method comprising the steps of:
providing at least one electrical line (13) extending in a longitudinal direction (L),
arranging optoelectronic components (15) on the at least one electrical line (13),
producing a sheath (17) around the at least one electrical line (13) and the optoelectronic components (15)
arranged thereon in an extrusion process.

23. The method according to number 22, characterized in that
the at least one electric line (13), in particular its front end, with the optoelectronic components (15) arranged thereon is conveyed through an extrusion device (23) to produce the sheathing (17).

24. The method according to number 22 or 23, characterized in that
the at least one electric line (13) is unwound from a bobbin (25).

25. The method according to any one of numbers 22 to 24, characterized in that
the at least one electric line (13) is arranged on a conveyor belt (31) so that the electric line (13) extends in longitudinal direction (L), and the at least one electric line (13) is equipped with the optoelectronic components (15).

26. The method according to number 25, characterized in that
the at least one electric line (13) with the optoelectronic components (15) is conveyed by means of the conveyor belt (31) through an extrusion apparatus (23) to produce the sheath (17).

LIST OF REFERENCE SIGNS 11 optoelectronic fiber
13 electric line
15 optoelectronic component
17 sheath
19 manufacturing device
21 placement device
23 extrusion apparatus
25 bobbin/coil
27 holding device
29 conveyor
31 conveyor belt
33 first roller
35 second roller
37 clamping device
39 light source
41 application device
43 feeder
45 feeder
47 extruding device
49 curing device
51 severing device
53 insulating material
55 interposer
57 control
59 contact points L longitudinal direction
U circumferential direction
D diameter

The invention claimed is:
1. A placement device for placing optoelectronic components on electrical lines, the placement device comprising:
a holding device for holding at least one electric line extending in a longitudinal direction; and
an application device for arranging optoelectronic components on the at least one electrical line,
wherein
the holding device comprises a conveying device for conveying the at least one electric line in the longitudinal direction,
the conveyor device comprises a conveyor belt, which is movable in the longitudinal direction and on which the at least one electric line is arranged, and
the conveyor belt comprises a carrier foil, wherein the at least one electrical line is implemented in the form of at least one conductive track extending longitudinally on the carrier foil, and wherein the carrier foil is peelable or dissolvable from the at least one conductive track via a chemical process, a thermal process, a mechanical process, or an irradiation process.

2. The placement device according to claim 1,
wherein the holding device is designed for holding at least two electrical lines, the electrical lines extending at least substantially parallel to one another and at a certain distance from one another in the longitudinal direction.

3. The placement device according to claim 1,
wherein a severing device for cutting at least one electrical line is arranged downstream of the holding device, as seen in the longitudinal direction, and wherein the holding device comprises a tensioning device for tensioning the electrical lines in the longitudinal direction.

4. An apparatus for producing an optoelectronic fiber, comprising:
the placement device according to claim 1; and
a sheathing apparatus configured to provide a sheath on which the at least one electrical line is arranged and aligned in the longitudinal direction, and cause at least one end section of the sheath lying in the transverse direction to be folded over to the longitudinal direction such that the sheath completely surrounds the at least one electrical line and the optoelectronic components arranged thereon in a circumferential direction around the longitudinal direction.

5. An optoelectronic fiber for integration into a textile, comprising:
at least one electrical line which extends in a longitudinal direction and on which optoelectronic components are arranged, and
a longitudinally extending sheath surrounding the at least one electrical line and the optoelectronic components,
wherein the sheath comprises a tubular structure having an inner surface that is free from contacting a portion of at least one of the optoelectronic components or the at least one electrical line,
wherein the tubular structure comprises a sheathing material folded around the optoelectronic components and the at least one electrical line in a circumferential direction running around the longitudinal direction in such a way that the sheath completely surrounds the components and electrical lines at least in sections,
wherein the sheathing material in the tubular structure has cured lateral ends extending in the longitudinal direction resulting in the tubular structure surrounding the optoelectronic components and the at least one electrical line in the circumferential direction, wherein, viewed transversely to the longitudinal direction, the sheath has an outer diameter which is at most 5 mm, and wherein, viewed in the longitudinal direction, the fiber has a minimum length of 5 m.

6. The fiber according to claim 5,
wherein at least two, three, four or even more electrical lines are provided which extend parallel to one another in the longitudinal direction and on which the optoelectronic components are arranged.

7. The fiber according to claim 5,
wherein the sheath is made of a material in such a way that the fiber can be integrated into a textile in the manner of a textile thread.

8. The fiber according to claim 5,
wherein the sheath is transparent or diffuse and/or contains a phosphor mixture and/or a conversion material and/or is formed in one piece.

9. The fiber according to claim 5,
wherein the fiber has, viewed in the longitudinal direction, a length of at least one of the following: 7.5 m, 10 m, 15 m, 20 m, or even a much greater length, such as several hundred meters or one or more kilometers.

10. The fiber according to claim 5,
wherein the optoelectronic components, viewed in the longitudinal direction, are arranged on the at least one electrical line spaced apart from one another, and
the optoelectronic components make electrical contact with the at least one electrical line.

11. The fiber according to claim 5,
wherein a number of optoelectronic components are arranged on an interposer, and a plurality of such interposers are arranged on the at least one electrical line, wherein viewed in the longitudinal direction, the interposers are spaced apart from one another.

12. The fiber according to claim 11,
wherein a controller is arranged on some or each of the interposers, wherein the controller of a respective interposer is designed for controlling optoelectronic components assigned to the controller.

13. The fiber according to claim 5,
wherein the fiber comprises at least one further electrical or electronic component, which is preferably arranged on the at least one electrical line.

14. The fiber according to claim 13,
wherein the component is arranged within the sheath, and the component is electrically connected to at least one electrical line.

* * * * *